(12) United States Patent
Cheng et al.

(10) Patent No.: US 8,853,038 B2
(45) Date of Patent: Oct. 7, 2014

(54) RAISED SOURCE/DRAIN STRUCTURE FOR ENHANCED STRAIN COUPLING FROM STRESS LINER

(75) Inventors: Kangguo Cheng, Schenectady, NY (US); Bruce Doris, Brewster, NY (US); Ali Khakifirooz, Schnectady, NY (US); Pranita Kulkarni, Slingerlands, NY (US); Ghavam Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 13/614,572

(22) Filed: Sep. 13, 2012

(65) Prior Publication Data

US 2013/0011975 A1    Jan. 10, 2013

Related U.S. Application Data

(63) Continuation of application No. 12/760,250, filed on Apr. 14, 2010, now Pat. No. 8,338,260.

(51) Int. Cl.
*H01L 21/336* (2006.01)
*H01L 29/66* (2006.01)
*H01L 29/786* (2006.01)
*H01L 21/762* (2006.01)

(52) U.S. Cl.
CPC .... *H01L 29/78654* (2013.01); *H01L 29/66772* (2013.01); *H01L 21/76283* (2013.01); *H01L 29/78618* (2013.01)
USPC .................................. 438/300; 257/E21.409

(58) Field of Classification Search
USPC .......................................... 438/151, 197, 300
See application file for complete search history.

(56) References Cited

U.S. PATENT DOCUMENTS

| 7,009,258 | B2 | 3/2006 | Park et al. |
| 7,053,400 | B2 | 5/2006 | Sun et al. |
| 7,138,320 | B2 | 11/2006 | Van Bentum et al. |
| 7,479,431 | B2 | 1/2009 | Hattendorf et al. |

(Continued)

OTHER PUBLICATIONS

Cheng, K., et al. "Fully Depleted Extremely Thin SOI Technology Fabricated by a Novel Integration Scheme Featuring Implant-Free, Zero-Silicon-Loss, and Faceted Raised Source/Drain," 2009 Symp. on VLSI Tech., Jun. 16-18, 2009, pp. 212-213.

(Continued)

*Primary Examiner* — Wensing Kuo
(74) *Attorney, Agent, or Firm* — Thomas Grzesik; Fleit Gibbons Gutman Bongini & Bianco PL

(57) ABSTRACT

A gate stack is formed on a silicon layer that is above a buried oxide layer. The gate stack comprises a high-k oxide layer on the silicon layer and a metal gate on the high-k oxide layer. A first nitride layer is formed on the silicon layer and the gate stack. An oxide layer is formed on the first nitride layer. A second nitride layer is formed on the oxide layer. The first nitride layer and the oxide layer are etched so as to form a nitride liner and an oxide liner adjacent to the gate stack. The second nitride layer is etched so as to form a first nitride spacer adjacent to the oxide liner. A faceted raised source/drain region is epitaxially formed adjacent to the nitride liner, the oxide liner, and first nitride spacer. Ions are implanted into the faceted raised source/drain region using the first nitride spacer.

9 Claims, 5 Drawing Sheets

(56) References Cited

U.S. PATENT DOCUMENTS

| | | | |
|---|---|---|---|
| 8,338,260 B2* | 12/2012 | Cheng et al. | 438/300 |
| 2005/0048732 A1 | 3/2005 | Park et al. | 438/305 |
| 2008/0157224 A1 | 7/2008 | Fischer et al. | |
| 2008/0217686 A1 | 9/2008 | Majumdar et al. | |
| 2009/0026504 A1 | 1/2009 | Okuda et al. | 257/255 |
| 2009/0039426 A1 | 2/2009 | Cartier et al. | 257/344 |
| 2009/0261363 A1 | 10/2009 | Chen et al. | |
| 2009/0275182 A1* | 11/2009 | Chang et al. | 438/287 |

OTHER PUBLICATIONS

Cheng, K., et al., "Extremely Thin SOI (ETSOI) CMOS with Record Low Variability for Low Power System-on-Chip Applications," 2009 IEEE Int. Elec Dev Meeting, Dec. 7-9, 2009.

Waite, A., et al., "Electrical Stressing of Submicrometre MOSFETs with Raised Source/Drain Structures Realised by Selective Epitaxial Growth of Silicon Using Silane Only," Electronics Letters, vol. 30, Issue 17, Aug. 18, 1994, pp. 1455-1456.

* cited by examiner

RAISED SOURCE/DRAIN STRUCTURE FOR ENHANCED STRAIN COUPLING FROM STRESS LINER

CROSS-REFERENCE TO RELATED APPLICATIONS

This application is a continuation of and claims priority from prior U.S. patent application Ser. No. 12/760,250 filed on Apr. 14, 2010, now U.S. Pat. No. 8,338,260; the entire disclosure is herein incorporated by reference in its entirety.

FIELD OF THE INVENTION

The present invention generally relates to the field of semiconductors, and more particularly relates to extremely-thin silicon-on-insulator field-effect transistors.

BACKGROUND OF THE INVENTION

Complementary Metal Oxide Semiconductor ("CMOS") Field Effect Transistors ("FETs") are employed in almost every electronic circuit application, such as signal processing, computing, and wireless communications. One known type of FET is an Extremely Thin Silicon-On-Insulator ("ETSOI") FET. One problem experienced with ETSOI FETs is the effectiveness of the nitride stress liner. In ETSOI designs with a raised-source and drain (RSD) design the effectiveness of the nitride liner is diminished. This is because the RSD proximity of the stress liner to the Si interface is reduced.

SUMMARY OF THE INVENTION

In one embodiment, a computer program storage product for forming a transistor is disclosed. The computer program storage product comprises instructions configured to perform a method. The method comprises forming a gate stack on a silicon layer that is above a buried oxide layer. The gate stack comprises a high-k oxide layer on the silicon layer and a metal gate on the high-k oxide layer. A first nitride layer is formed on the silicon layer and the gate stack. An oxide layer is formed on the first nitride layer. A second nitride layer is formed on the oxide layer. The first nitride layer and the oxide layer are etched so as to form a nitride liner and an oxide liner adjacent to the gate stack. The second nitride layer is etched so as to form a first nitride spacer adjacent to the oxide liner. A faceted raised source/drain region is epitaxially formed adjacent to the nitride liner, the oxide liner, and first nitride spacer. The faceted raised source/drain region comprises a first faceted side portion and a second faceted side portion. Ions are implanted into the faceted raised source/drain region using the first nitride spacer to align the implantation.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
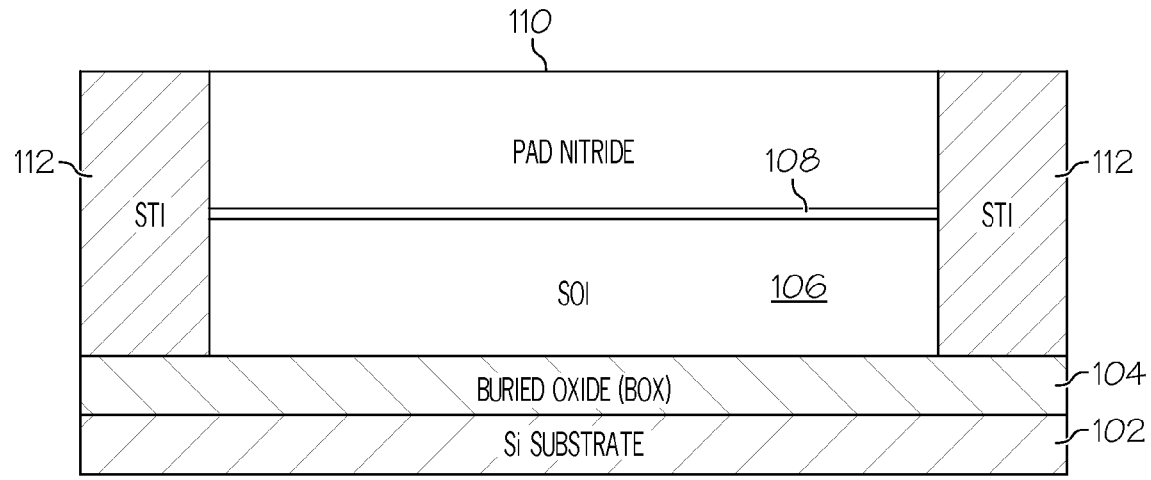
FIGS. 1 to 9 are cross-sectional views of a process for forming an extremely-thin silicon-on-insulator transistor with faceted raised source/drains according to an embodiment of the present invention.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

FIGS. 1 to 9 illustrate a process for forming an extremely-thin silicon-on-insulator transistor according to an embodiment of the present invention. The process begins with an SOI wafer that is formed by a silicon substrate 102, a buried oxide layer ("BOX") 104, and an SOI layer 106. It should be noted that various embodiments of the present invention are applicable to conventional bulk silicon, partially depleted silicon on insulator, extremely thin silicon on insulator, and/or finfet transistors. In an embodiment where the SOI wafer is a "thin" SOI wafer it can have a thickness in the 15-30 nm range. Alternatively, the process can begin with a "thick" SOI wafer having a thickness in the 30-90 nm range, and thinning can be performed using oxidation and a hydrofluoric acid (HF) wet etch to reduce the thickness (e.g., down to the 15-30 nm range).

An active area for the transistor is then defined. In this embodiment, the active area is defined through pad-film deposition, photolithography, and reactive-ion etching ("RIE"). In particular, a pad oxide 108 (e.g., having a thickness of 2-10 nm) is formed in a conventional oxidation furnace, and a pad nitride 110 (e.g., having a thickness of 30-150 nm) is deposited using low-pressure chemical vapor deposition ("LPCVD") or rapid-thermal chemical vapor deposition ("RTCVD"). Photolithography and a nitride-oxide-silicon RIE are then performed to define the active area.

Next, the active area is isolated, such as through shallow trench isolation ("STI"). In this embodiment, STI is obtained through deposition of an STI oxide, densification anneals, and chemical-mechanical polishing ("CMP") that stops on the pad nitride 110. This forms an STI region 112 over the BOX layer 104 that is continuous around the active area, as shown in FIG. 1.

Figure 2:
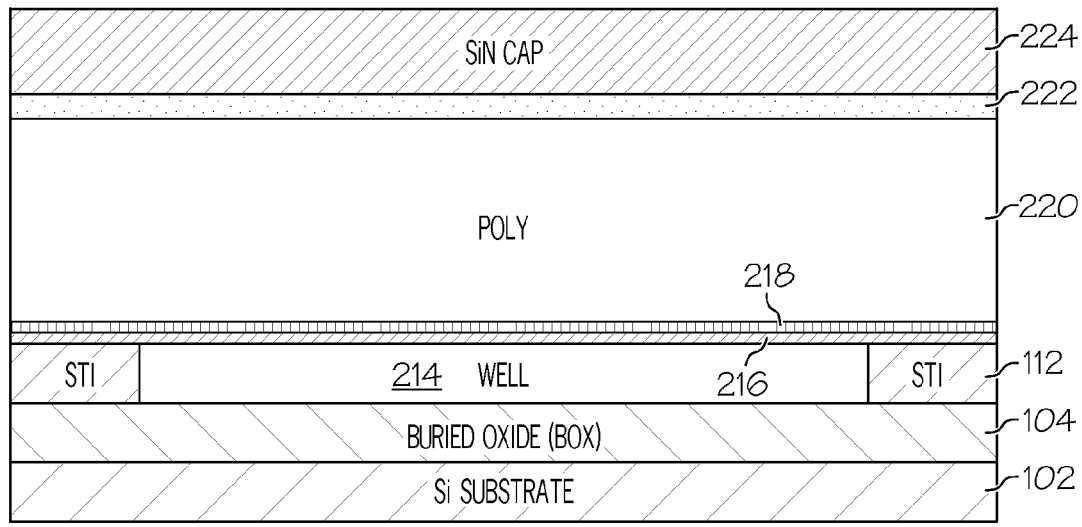

The pad nitride 110, along with any STI oxide remaining on the pad nitride, and the pad oxide 108 are then removed (e.g., through wet etching using hot phosphoric acid and HF). In an embodiment where well implants are to be created a sacrificial oxide layer is formed through oxidation to create a screening layer for the subsequent well implants. In this embodiment, the well implants are then created using photolithography to selectively define NFET and PFET areas for the wells, and then ions are implanted to form the wells 214, as shown in FIG. 2. A well for an NFET is formed by implanting p-type species (such as B, $BF_2$, or In), while a well for a PFET is formed by implanting n-type species (such as As, P, or Sb). An anneal is performed after well implantation to heal the damage to the thin SOI layer due to ion implantation. Alternatively, well implantation is skipped to create a completely undoped device. The sacrificial oxide layer is then removed (e.g., using HF).

Most semiconductor integrated circuits include input/output (I/O) transistors that need a thick gate oxide to allow operation operate at higher voltages. However, high-speed transistors in the same integrated circuit are formed with thin gate oxide layers. To provide both types of transistors in the same integrated circuit, a thick gate oxide layer is first formed through deposition over the entire wafer. Then, the thick-oxide transistors are masked off using photolithography, and the thick gate oxide layer is removed (e.g., using an HF etch) from areas for the thin gate oxide transistors.

A high-K oxide layer 216 and a metal gate layer 218 are then deposited, as shown in FIG. 2. In this embodiment, the high-K oxide layer 216 is deposited using metal-organic chemical vapor deposition ("MOCVD") or atomic-layer deposition ("ALD"). A metal gate layer 218 is then deposited on the high-K oxide layer 216, such as by using physical vapor deposition ("PVD"), MOCVD, or ALD. Next, a gate polysilicon cap 220 is deposited on the metal gate layer 218, such as through LPCVD or silicon sputtering. A screen oxide layer 222 is then deposited onto the polysilicon cap 220 as a screen for subsequent gate implants, and also to protect the doped polysilicon from coming into contact with the etchant used during disposable spacer removal. In this embodiment, the screen oxide 222 is deposited using RTCVD or plasma-enhanced chemical vapor deposition ("PECVD").

The polysilicon cap 220 is then doped to lower gate line resistance, which is desired for high-speed switching of the transistor. In this embodiment, doping is performed selectively through the use of photolithography, with NFETs receiving n-type ion implants and PFETs receiving p-type ion implants.

Next, a silicon nitride cap 224 is deposited to allow the later formation of a silicon (or SiGe) raised source/drain through epitaxy. In particular, the nitride cap 224 protects the polysilicon gate during epitaxy to avoid forming a polysilicon (or poly-SiGe) mushroom on the gate line, which would adversely affect transistor performance as well as transistor yield. In some embodiments, an oxide cap is next deposited to act as a hardmask for gate etch.

Figure 3:
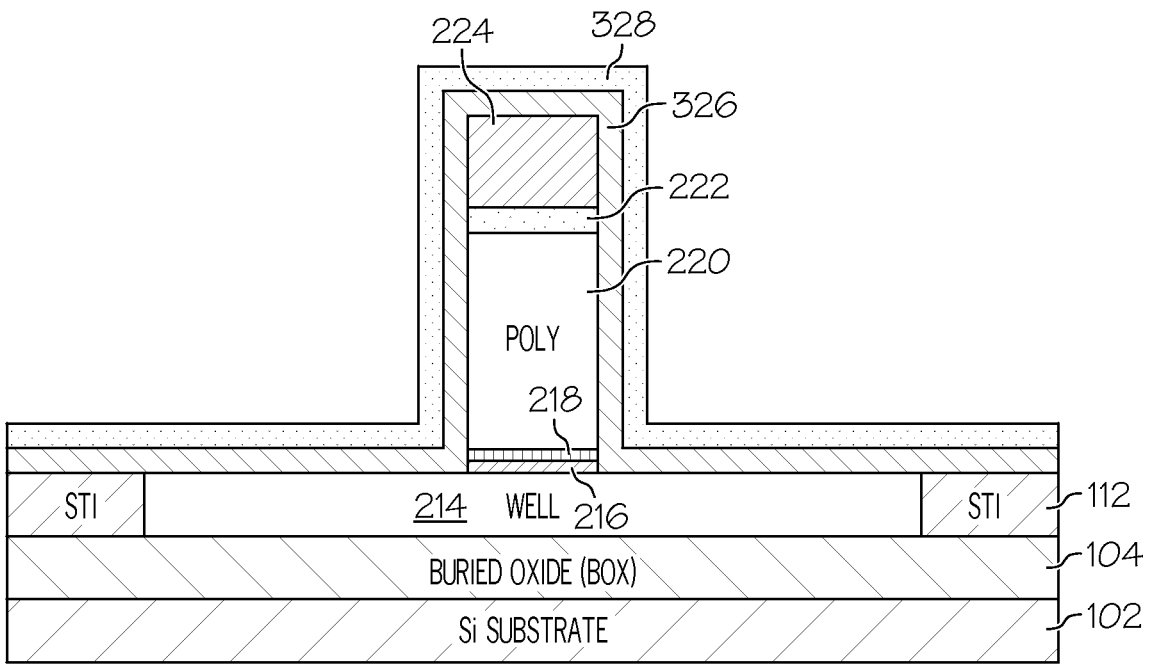

The transistor gate is then defined using photolithography, RIE, and wet cleaning. The wet cleaning removes any polymers formed during the RIE and the oxide cap if previously formed on top of the nitride cap 224. As shown in FIG. 3, the resulting gate stack is formed by the high-k dielectric layer 216, the metal gate layer 218, the polysilicon cap layer 220, the poly screen oxide layer 222, and the silicon nitride cap layer 224.

A thin nitride liner 326 (e.g., with a 2-5 nm thickness) is then deposited to cap the gate stack. This nitride liner acts as a diffusion barrier to oxygen and prevents the formation of an underlayer of silicon oxide (or "underoxide") beneath the high-K oxide layer, which would lower the gate capacitance and the transistor drive current. A thin oxide liner 328 (e.g., with a 2-5 nm thickness) is then deposited atop the nitride liner 326. This oxide liner acts as the etch stop layer for the later nitride RIE during disposable spacer formation, and prevents this RIE from consuming the underlying silicon, which would lead to a very high transistor series resistance and lower the transistor drive current.

Figure 4:
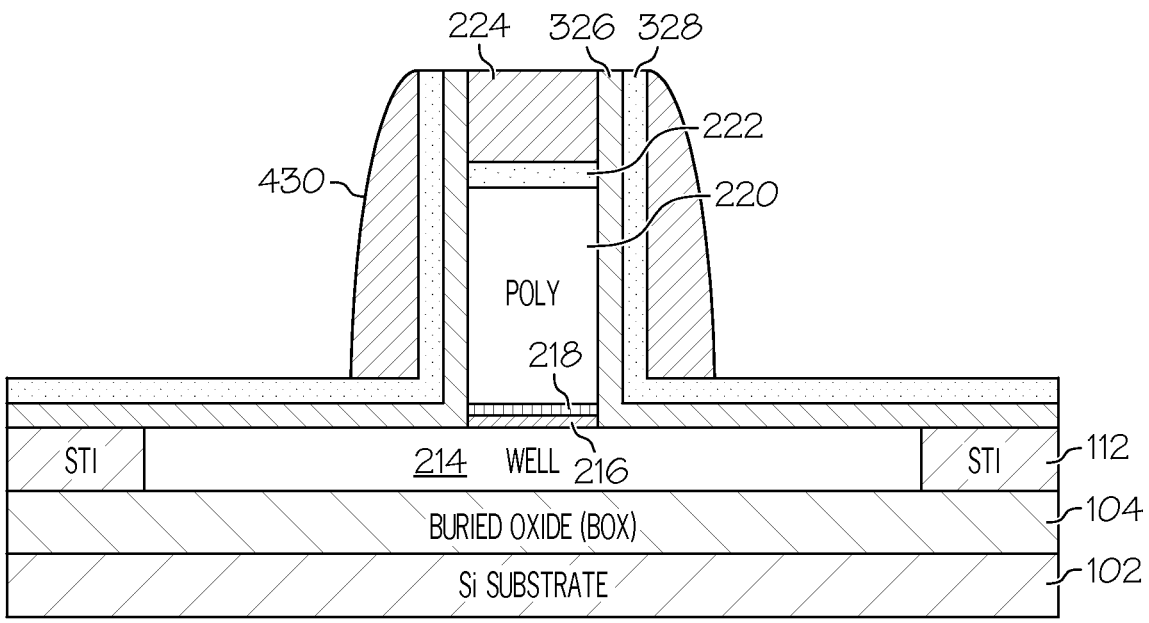

An optional disposable nitride spacer 430 (e.g., with a 5-50 nm thickness) can then be formed on all of the transistors, as shown in FIG. 4. However, it should be noted that this disposable spacer 430 is not required. The disposable spacer 430 allows stressed nitride layer 326 to be closer to the channel. The disposable nitride spacer 430 is formed through nitride deposition (e.g., using RTCVD or PECVD) and then an RIE that stops on the underlying oxide liner and thus does not consume any of the underlying silicon.

Figure 5:
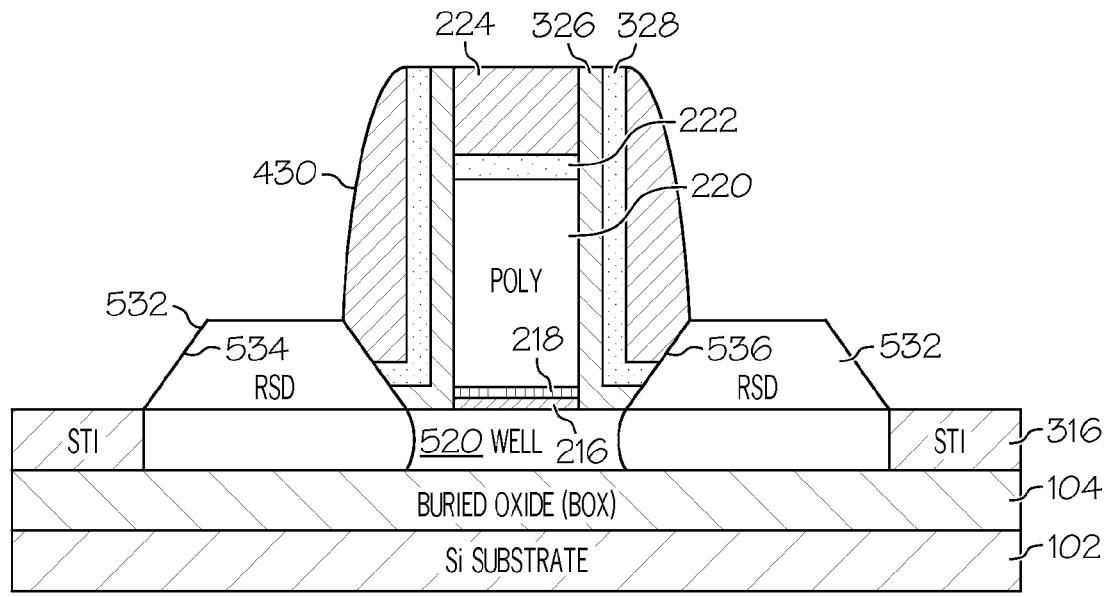

A faceted raised source/drain 532 is then formed using epitaxy, as shown in FIG. 5. This thickens the silicon area where deep source/drain implantation is to be performed, in order to reduce the transistor series resistance, and increase the transistor on current. To form the faceted raised source/drain 532, an initial pre-cleaning removes the oxide and liners and exposes the silicon surface in the source/drain areas. In this embodiment, the pre-cleaning is performed using an HF wet etch or HF-vapor based chemical oxide removal ("COR"). This produces, on each side of the gate stack, a spacer structure formed by the nitride layer 326 and the oxide layer 328 (an optionally the disposable layer 430) above the horizontal portion of the oxide layer 328.

Next, epitaxy that is selective with respect to oxide and nitride is used to form the faceted raised source/drain 532, so there is no deposition on the nitride cap 224, the nitride-oxide spacers 326, 328 (and nitride disposable spacer 430 if used), and the STI oxide 112. The faceted raised source/drains 532 comprise in-situ doping (boron, in one embodiment for PFET and phosphorus, in one embodiment, for NFET). In this embodiment, the faceted raised source/drain 532 is formed of silicon (or SiGe or SiC or SiGeC). It should be noted that, according to one embodiment, raised source/drain 532 may not contain any doping. In the present embodiment, the doping can be performed using any standard approach such as ion implantation. In particular, the growth rates for (100) vs. (110) oriented planes are engineered so that during the epitaxial growth on (100) Si faceted raised/source drains are obtained. As can be seen from FIG. 5, the faceted raised source/drains 532 comprise angled sides 534, 536 rather than completely abutting the gate. Each of the faceted sides 534, 536, in one embodiment, is angled with an angle from 5 degrees to 85 degrees relative to a bottom surface of the faceted raised source/drain region. According to another embodiment, each of the faceted sides 534, 536, is angled with an angle from 40 degrees to 55 degrees relative to a bottom surface of the faceted raised source/drains 532. In another embodiment, the angle for each of the faceted sides 534, 536, is angle substantially less than 90 degrees and substantially greater than zero degrees. Moreover, the angle of one of the faceted sides 534, 536 can be different than the angle of the other one of the faceted sides 534, 536.

Figure 10:
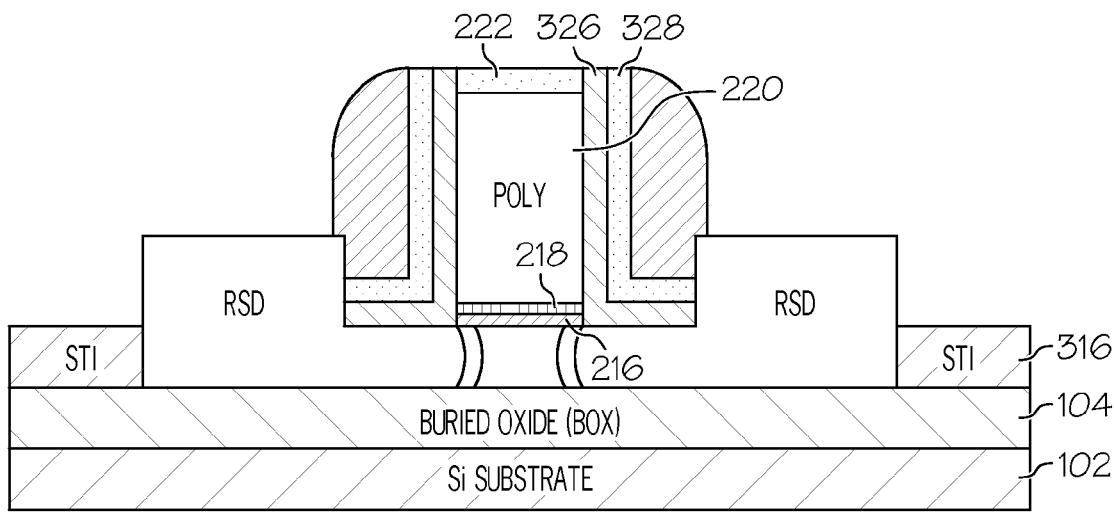
FIG. 10 is a cross-sectional view of a conventional Field Effect Transistor with conventional raised source/drains.

Conventional methods grow the raised source/drains in a completely planar direction from the bottom-up as shown in FIG. 10. The faceted raised source/drains of various embodiments of the present invention are advantageous over the conventional raised source/drains because they allow a nitride stress liner to be in closer proximity to the channel than conventional raised source/drains. This closer proximity is beneficial in enhancing the coupling of the liner stress to the channel. Higher stress in the channel correlates with higher mobility and, therefore, higher effective derive current/performance. The faceted raised source/drains reduce S/D resistance while minimizing gate-to-S/D parasitic capacitance.

Figure 6:
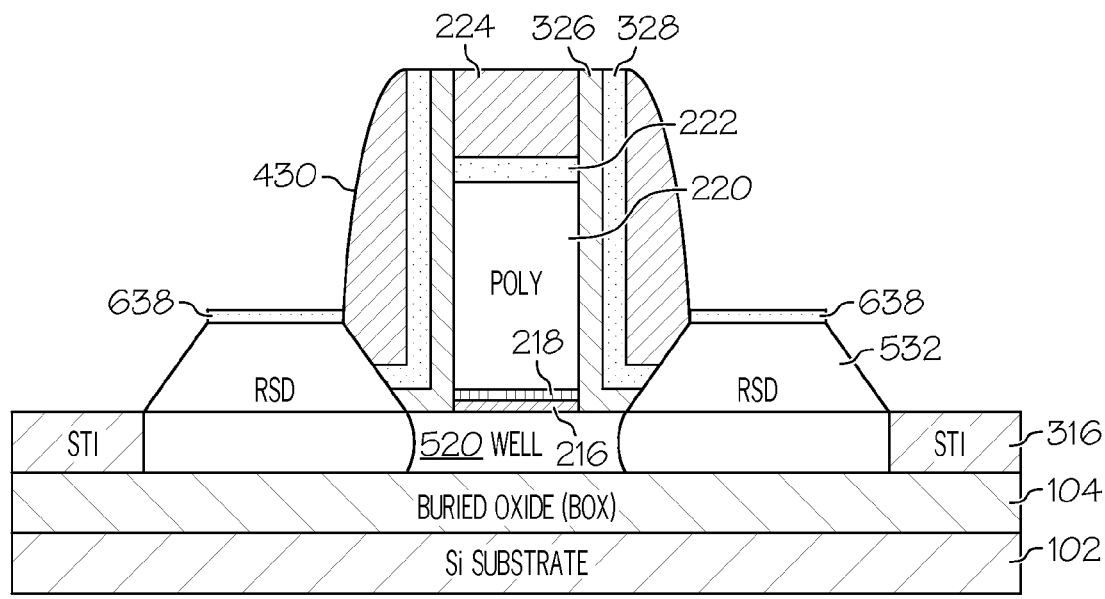

The faceted raised source/drain 532 is then oxidized to create a thin RSD oxide layer 638, as shown in FIG. 6. This RSD oxide layer 638 protects the doped raised source/drain from coming into contact with the etchant used during disposable spacer removal. In this embodiment, the RSD oxide layer 638 is created in an oxidation furnace at low temperature to avoid any possibility of underoxide growth. While the oxidation rate at low temperature is generally low, it can be enhanced using a high pressure or a plasma process.

Figure 7:
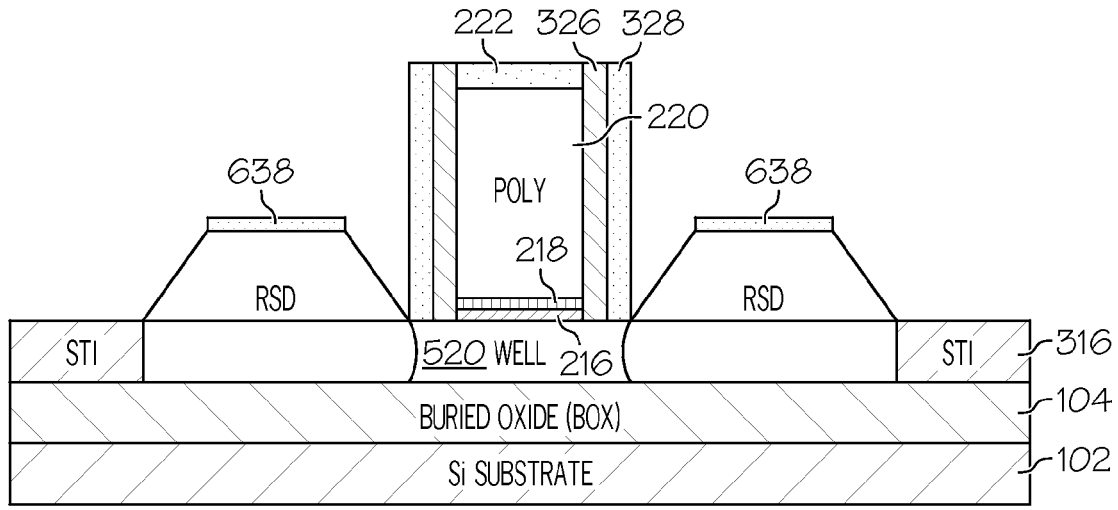

The nitride cap 224 (and disposable nitride spacer 430 is used) is then removed (e.g., through a hot phosphoric acid etch), as shown in FIG. 7. The doped polysilicon gate line 220 is encapsulated by the poly screen oxide 224 and the oxide liner 328, and the doped faceted raised source/drain 532 is capped by the RSD oxide layer 638. Therefore, these doped regions do not come into contact with the etchant (e.g., hot phosphoric acid) and are not etched away.

Figure 8:
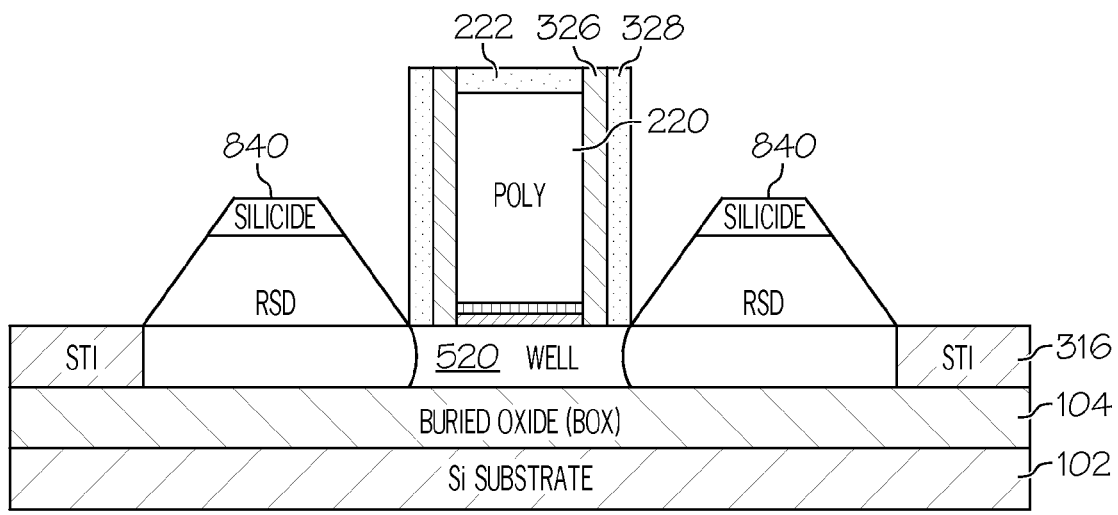

Next, silicide areas 840 and 842 are formed for contacts using the spacer structure for alignment, as shown in FIG. 8. In this embodiment, this is achieved by removing the oxide (e.g., through a wet etch using HF), depositing a metal, performing an anneal to form silicide, and then selectively removing the metal but leave the silicide untouched (e.g., through an aqua regia wet etch). In this exemplary embodiment, the metal is nickel, cobalt, titanium, or platinum.

Figure 9:
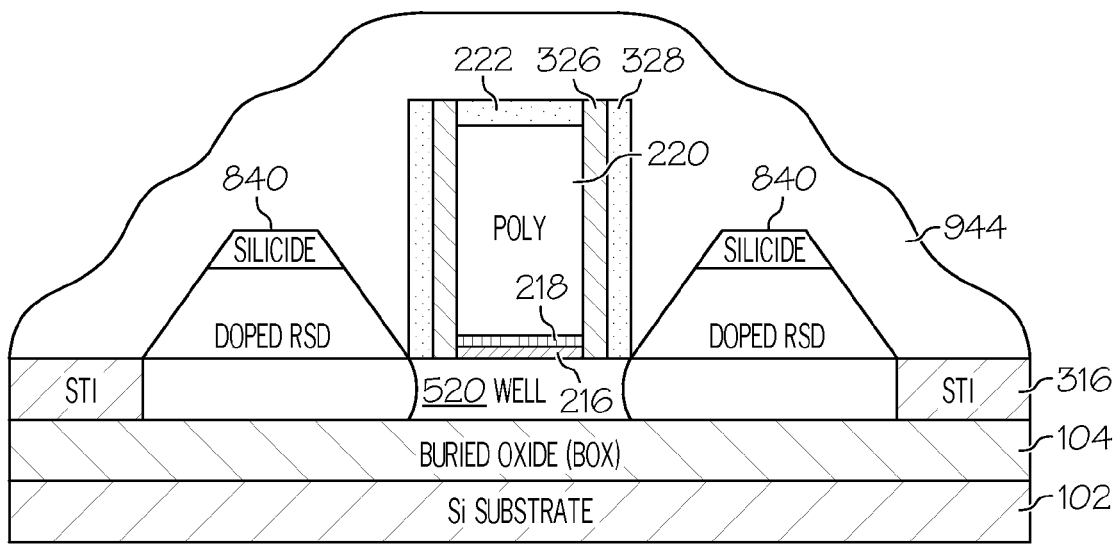

A stress liner 944 may then be formed over the substrate for optimization of the device performance. Depending on whether the transistors are PFETs or NFETs, the stress liner will comprise either a compressive stress liner or a tensile stress liner, respectively. In one embodiment, the stress line 944 is formed by depositing the stress liner 944 over the entire substrate surface to cover both NFET and PFET regions. The stress liner 944 may be a compressive stressed liner for enhancement of the PFET devices, or it may be a tensile stressed liner for enhancement of the NFET devices. Compressive and tensile stressed liners may include, but are not limited to, a compressive stressed nitride contact etch stop layers (e.g., silicon nitrides), stressed oxides layers (e.g., silicon oxides), and the like. Conventional process can be used to form the stress liner 944. The resulting ETSOI transistor structure is shown in FIG. 9. From this point, conventional fabrication processes are used to form the remainder of the integrated circuit that includes this transistor.

The resulting structure, as one example, can comprise A 25 nm gate length (LG), 6 nm SOI channel ($T_{Si}$), and 15 nm spacer. The zero-silicon-loss process enables ETSOI down to 1.9 nm with successful RSD epi. Both high-k and metal gate layers are completely sealed and protected by the nitride spacer during subsequent processing. TCAD and SIMS results show good junction abruptness after drive-in anneal. Compared with conventional vertical RSD epi, the faceted RSD epi of various embodiments of the present invention enables at least 15% reduction in total gate to S/D capacitance at constant S/D resistance.

The resulting structure comprises a scaled gate length with narrow spacer with good electrostatics as well as high drive current appropriate for 22-nm node low-power (LP) applications. As discussed above, various embodiments of the present invention are applicable to bulk Si, ETSOI, PDSOI, finfet transistors, and the like. ETSOI devices are attractive due to their ability to control short-channel effects entirely by ultra-thin SOI without channel doping. It should be noted, as discussed above, various embodiments of the present invention have excellent short-channel behaviors down to LG=25 nm with TSi=6 nm. With the same high-k/MG stack for both NFET and PFET, steep subthreshold swing of less than 90 mV/dec and DIBL less than 100 mV/V are obtained at LG=25 nm and Tinv=1.6 nm. PFET exhibits strong performance of Idsat=550 µA/µm at Ioff=3 nA/µm, VDD=0.9V, and LG=25 nm without any strain boosters. This result is very impressive even when compared with state-of-the-art bulk LP devices with eSiGe. NFET performance is also among the best ETSOI results reported. The high drive current of PFETs can be attributed to low extension resistance (Rext<200 Ω·µm) by our novel implant-free process that eliminates implant-related damages and enables nearly 100% dopant activation. Low GIDL (20 µA/µm) and gate leakage (0.5 nA/µm2) make devices attractive for LP applications.

Non-Limiting Examples

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A computer program storage product for forming a transistor, wherein the computer program storage product comprises instructions configured to perform a method comprising:

forming a gate stack on a silicon layer that is above a buried oxide layer, the gate stack comprising a high-k oxide layer on the silicon layer and a metal gate on the high-k oxide layer;

forming a first nitride layer on the silicon layer and the gate stack;

forming an oxide layer on the first nitride layer;

forming a second nitride layer on the oxide layer;

etching the first nitride layer and the oxide layer so as to form a nitride liner and an oxide liner adjacent to the gate stack;

etching the second nitride layer so as to form a first nitride spacer adjacent to the oxide liner;

epitaxially forming a faceted raised source/drain region adjacent to the nitride liner, the oxide liner, and first nitride spacer, wherein the faceted raised source/drain region comprises a first faceted side portion and a second faceted side portion, wherein the eptiaxially forming further comprises forming at least a portion of the first faceted side portion extending under at least a portion of the first nitride spacer, a portion of the oxide liner, and a portion of the nitride liner, wherein the portions of the first nitride spacer, oxide liner, and nitride liner extend over the portion of the first faceted side portion; and implanting ions into the faceted raised source/drain region using the first nitride spacer to align the implantation.

2. The computer program storage product of claim 1, wherein the method further comprises:

forming a stress liner over at least the gate stack, the nitride liner, the oxide line, and the faceted raised source/drain region.

3. The computer program storage product of claim 1, wherein the method further comprises:
    removing the first nitride spacer;
    forming a second spacer adjacent to the oxide liner; and
    forming a silicide area of the raised source/drain region using the second spacer to align the silicide area.

4. The computer program storage product of claim 3, wherein forming the second spacer comprises:
    depositing a third nitride layer; and
    etching the third nitride layer.

5. The computer program storage product of claim 1, wherein each of the first and second faceted side portions is angled with an angle from 5 degrees to 85 degrees relative to a bottom surface of the faceted raised source/drain region.

6. The computer program storage product of claim 5, wherein each of the first and second faceted side portions is angled with an angle from 40 degrees to 45 degrees relative to a bottom surface of the faceted raised source/drain region.

7. The computer program storage product of claim 1, wherein the gate stack comprises a polysilicon layer over the metal gate layer, and wherein the gate stack comprises a silicide layer over the polysilicon layer.

8. The computer program storage product of claim 2, wherein the faceted raised source/drain region reduces a distance between the stress liner and a channel of the transistor.

9. The computer program storage product of claim 8, where the reduced distance increases a stress imparted on the channel by the stress liner.

* * * * *